United States Patent
Maitrejean et al.

(10) Patent No.: US 9,853,130 B2
(45) Date of Patent: Dec. 26, 2017

(54) METHOD OF MODIFYING THE STRAIN STATE OF A SEMICONDUCTING STRUCTURE WITH STACKED TRANSISTOR CHANNELS

(71) Applicant: Commissariat a L'Energie Atomique et aux Energies Alternatives, Paris (FR)

(72) Inventors: Sylvain Maitrejean, Grenoble (FR); Emmanuel Augendre, Montbonnot (FR); Jean-Charles Barbe, Izeron (FR); Benoit Mathieu, Grenoble (FR); Yves Morand, Grenoble (FR)

(73) Assignee: Commissariat á l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 15/049,468

(22) Filed: Feb. 22, 2016

(65) Prior Publication Data
US 2016/0254362 A1      Sep. 1, 2016

(30) Foreign Application Priority Data

Feb. 24, 2015 (FR) ..................... 15 51566

(51) Int. Cl.
*H01L 21/469* (2006.01)
*H01L 29/66* (2006.01)
(Continued)

(52) U.S. Cl.
CPC .... *H01L 29/6681* (2013.01); *H01L 21/02532* (2013.01); *H01L 21/3065* (2013.01);
(Continued)

(58) Field of Classification Search
CPC ........... H01L 21/02532; H01L 21/3065; H01L 21/31144; H01L 29/0673; H01L 29/775;
(Continued)

(56) References Cited

U.S. PATENT DOCUMENTS

2005/0170606 A1*  8/2005  Fu ........................... A61F 2/958
                                                                 438/424
2008/0169508 A1   7/2008  Chidambarrao et al.
(Continued)

FOREIGN PATENT DOCUMENTS

WO   WO 2013/095341 A1   6/2013

OTHER PUBLICATIONS

French Preliminary Search Report issued Dec. 15, 2015 in FR 15 51566, filed Feb. 24, 2015 (with English Translation of Categories of Cited Documents).
(Continued)

*Primary Examiner* — Lan Vinh
(74) *Attorney, Agent, or Firm* — Oblon, McClelland, Maier & Neustadt, L.L.P.

(57) ABSTRACT

A method of modifying a strain state of a first channel structure in a transistor is provided, said structure being formed from superposed semiconducting elements, the method including providing on a substrate at least one first semiconducting structure formed from a semiconducting stack including alternating elements based on at least one first semiconducting material and elements based on at least one second semiconducting material different from the first material; then removing portions of the second material from the first semiconducting structure by selective etching, the removed portions forming at least one empty space; filling the empty space with a dielectric material; forming a straining zone on the first semiconducting structure based on a first strained material having an intrinsic strain; and performing thermal annealing to cause the dielectric material to creep, and to cause a change in a strain state of the elements based on the first material.

10 Claims, 6 Drawing Sheets

(51) Int. Cl.

| | |
|---|---|
| *H01L 29/06* | (2006.01) |
| *H01L 21/02* | (2006.01) |
| *H01L 29/78* | (2006.01) |
| *H01L 21/3065* | (2006.01) |
| *H01L 21/311* | (2006.01) |
| *H01L 29/423* | (2006.01) |
| *H01L 29/786* | (2006.01) |

(52) U.S. Cl.
CPC .... *H01L 21/31144* (2013.01); *H01L 29/0673* (2013.01); *H01L 29/42392* (2013.01); *H01L 29/6653* (2013.01); *H01L 29/66553* (2013.01); *H01L 29/66795* (2013.01); *H01L 29/7843* (2013.01); *H01L 29/7847* (2013.01); *H01L 29/78696* (2013.01)

(58) Field of Classification Search
CPC ........... H01L 29/42392; H01L 29/6653; H01L 29/66795
USPC ....... 438/442, 594, 706, 710, 712, 714, 778, 438/787
See application file for complete search history.

(56) References Cited

U.S. PATENT DOCUMENTS

| | | | |
|---|---|---|---|
| 2013/0056820 A1* | 3/2013 | Jeong | H01L 27/0688 257/324 |
| 2014/0097502 A1 | 4/2014 | Sun et al. | |
| 2014/0099793 A1 | 4/2014 | Sun et al. | |
| 2014/0326955 A1 | 11/2014 | Barraud et al. | |
| 2015/0044826 A1 | 2/2015 | Morin et al. | |
| 2015/0137210 A1* | 5/2015 | Nam | H01L 27/11582 257/324 |
| 2015/0155170 A1 | 6/2015 | Reboh et al. | |
| 2015/0179474 A1 | 6/2015 | Maitrejean et al. | |
| 2015/0179665 A1 | 6/2015 | Reboh et al. | |
| 2015/0340438 A1* | 11/2015 | Zhu | H01L 29/78648 257/77 |
| 2016/0005862 A1 | 1/2016 | Reboh et al. | |

OTHER PUBLICATIONS

T. Ernst et al. "Novel 3D Integration Process for Highly Scalable Nano-Beam Stacked-Channels GAA (NBG) FinFETs with $HfO_2$/TiN Gate Stack", IEEE Electron Devices Meeting, 2006, 4 pages.

C. Dupre et al. "15nm-Diameter 3D Stacked Nanowires with Independent Gates Operation: ϕFET" , IEEE Electron Devices Meeting, 2008, 4 pages.

Stephan Borel et al. "Control of Selectivity Between SiGe and Si in Isotropic Etching Processes", Japanese Journal of Applied Physics, vol. 43, No. 6B, 2004, 4 pages.

N. R. Rueger et al. "Selective Etching of $SiO_2$ Over Polycrystalline Silicon using $CHF_3$ in an Inductively Coupled Plasma Reactor", J. Vac. Sci. Technol. A, vol. 17, No. 5, Sep./Oct. 1999, 11 pages.

U.S. Appl. No. 14/849,060, filed Sep. 9, 2015, Sylvain Maitrejean et al.

U.S. Appl. No. 14/901,027, filed Dec. 27, 2015, Thomas Signamarcheix et al.

U.S. Appl. No. 14/950,416, filed Nov. 24, 2015, Shay Reboh et al.

U.S. Appl. No. 14/976,958, filed Dec. 21, 2015, Fabien Deprat et al.

Larissa Djomeni et al. "Study of Low Temperature MOCVD Deposition of TiN Barrier Layer for Copper Diffusion in High Aspect Ratio Through Silicon Vias", Microelectronic Engineering, 2013, 7 pages.

Luo Liechao et al. "Low Stress TiN as Metal Hard Mask for Advance Cu-Interconnect", ECS Transaction, vol. 44, No. 1, 2012, 6 pages.

* cited by examiner

METHOD OF MODIFYING THE STRAIN STATE OF A SEMICONDUCTING STRUCTURE WITH STACKED TRANSISTOR CHANNELS

TECHNICAL DOMAIN AND PRIOR ART

This invention relates to the field of microelectronics and more particularly transistors provided with a stacked channel semiconducting structure, in other words a structure composed of semiconducting elements such as nanowires, or bars, or membranes, located above each other.

Transistor performances can be improved by making their channel region from a semiconducting material with a mechanical tensile or compression strain.

A tensile strain induced for example in a silicon transistor channel can increase the electron velocity, while when a compression strain is imposed on a silicon channel, the conduction velocity by holes is increased.

It is known how to make a microelectronic device comprising a first N type transistor with a planar channel structure made from a material with a tensile strain and a second P type transistor comprising a channel region made from a relaxed material or a material with a compression strain, on the same substrate.

Document US2008/0169508A1 describes an example method in which silicon blocks are strained differently on the same substrate.

It is known how to make stacked transistor channel structures to improve control over transistor channels and to improve their integration density.

The question that arises is the ability to modulate the strain state of such structures.

PRESENTATION OF THE INVENTION

One embodiment of this invention relates to a method of modifying the strain state of a stacked channel structure of a first transistor, this structure being formed from semiconducting elements located above each other, the method comprising the following steps:

a) provide at least one first semiconducting structure on a substrate, formed from a semiconducting stack comprising an alternation of elements based on at least one first semiconducting material and elements based on at least one second semiconducting material different from the first semiconducting material, then b) remove portions of the second semiconducting material by selective etching, removed portions of the second semiconducting material forming one or several empty spaces, c) fill in the empty spaces with a dielectric material, d) form a straining zone on the first structure, based on a first strained material with an intrinsic strain, e) perform appropriate thermal annealing so as to make the dielectric material creep, and cause a change in the strain state of elements based on the first semiconducting material in the first structure.

Such a method is appropriate for the manufacture of a device provided with a first transistor and at least one second transistor with a second channel structure with semiconducting elements placed above each other, the second semiconducting structure being provided in step a) in the semiconducting stack and also comprising an alternation of elements based on at least one first semiconducting material.

In this case, step d) in which the straining zone is produced may include the following steps:

deposit the first strained material on the first structure and on the second structure, and then remove the first strained material from the second structure.

The first structure of the first transistor and the second structure of the second transistor can thus have different strains.

The method may also include the formation of another straining zone on the second structure, based on a second strained material with an intrinsic strain opposite to the intrinsic strain of the first strained material.

Opposite strain means that when the first strained material has a tensile intrinsic strain, the second strained material has an intrinsic compressive strain and vice versa.

Manufacturing of this other straining zone may comprise steps to:

deposit the second strained material on the first structure and on the second structure, and then remove the second strained material from the first structure.

Appropriate thermal annealing can thus be carried out to make the dielectric material creep, and to cause a change in the strain state of elements based on the first semiconducting material in the second structure. This annealing may be done during step e) at the same time as the annealing done to modify the strain state of the first structure.

According to one possible embodiment of the method, the first structure and the second structure obtained in step a) may be attached to each other by means of at least one anchor block.

This anchor block may be removed before step e).

Advantageously, the anchor block may be removed after step d) in which the straining zone is formed by etching, making use of this straining zone as a protective stencil for this etching.

According to one possible embodiment of the method, the substrate provided in step a) may be a strained semiconducting on insulator type substrate provided with a strained surface semiconducting layer. In this case, the change in the strain state in step e) is relaxation of the elements based on the first semiconducting material.

According to another possible embodiment of the method, the substrate provided in step a) may be a strained semiconducting on insulator type substrate provided with a relaxed surface semiconducting layer. In this case, the change in the strain state in step e) is an increase in a tensile or compressive strain state induced by the straining zone in the elements based on the first semiconducting material.

When the straining zone is designed to induce a tensile strain in the elements based on the first semiconducting material, the change in the strain state in step e) may be an increase in the tensile strain in the elements based on the first semiconducting material.

According to one possible embodiment of the method, the dielectric material filling the empty spaces may be based on $SiO_2$ or doped silicon oxide, particularly doped with boron and/or phosphorus.

According to one possible embodiment of the method, the first semiconducting material may be Si while the second semiconducting material is $Si_{1-x}Ge_x$, where x>0.

According to one possible embodiment of the method, the first semiconducting material may be $Si_{1-y}Ge_y$ where y>0 while the second semiconducting material is Si.

BRIEF DESCRIPTION OF THE DRAWINGS

This invention will be better understood after reading the description of example embodiments given purely for information and that are in no way limitative, with reference to the appended drawings in which.

Identical, similar or equivalent parts in the various figures have the same numeric references so as to facilitate comparisons between the different figures.

The different parts shown on the figures are not necessarily all at the same scale to make the figures more easily understandable.

Furthermore, in the following description, terms that depend on the orientation such as <<on>>, <<above>>, <<top>>, <<lateral>> etc. of a structure should be understood as being applicable when the structure is oriented as shown on the figures.

DETAILED PRESENTATION OF PARTICULAR EMBODIMENTS

One example embodiment of a device with a first stacked channel structure of a transistor of a first type and a second stacked channel structure of a transistor of a second type, will now be described with reference to FIGS. 1A-1M.

Figure 1A:
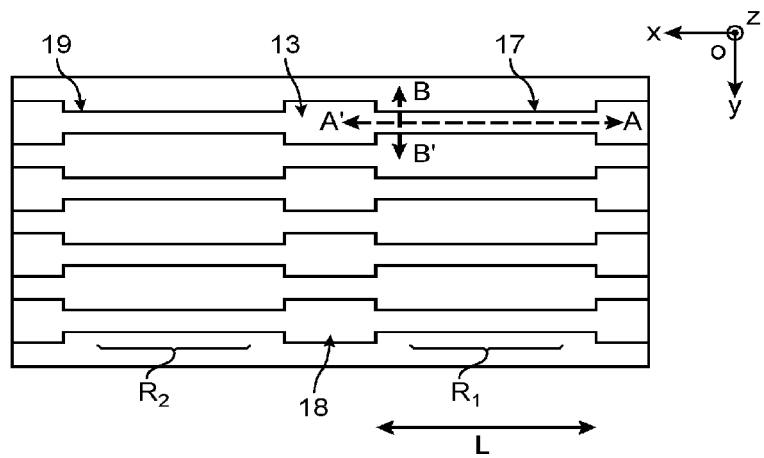
FIGS. 1A-1M show a first example of a method according to one embodiment of the invention, that can relax a stacked channel semiconducting structure 2 0 of a first transistor.
Figure 1B:
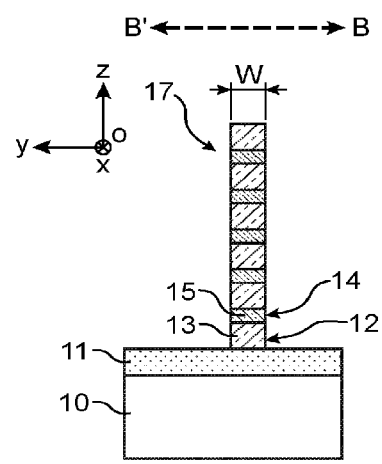
Figure 1C:
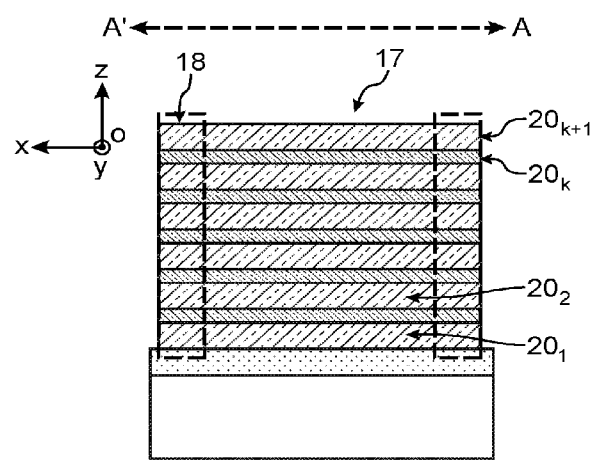

FIGS. 1A-1C show one possible initial device for making this example method from a strained semiconductor on insulator type substrate, for example of the sSOI (strained Silicon on Insulator) type.

This substrate thus comprises a semiconducting support layer 10 coated with an insulating layer 11 that may be based on silicon oxide. The substrate also comprises a so-called surface semiconducting layer 12 located on and in contact with the insulating layer 11. The surface semiconducting layer 12 is based on a first crystalline semiconducting material 13. In this example, the crystalline semiconducting material 13 is strained and may for example be tensile strained silicon.

Several other semiconducting layers are made on the surface semiconducting layer 12, for example by several successive epitaxies, forming a semiconducting stack with the surface layer. The semiconducting stack is formed from an alternation of one or several layers 12 based on the first semiconducting material 13 and one or several layers 14, based on a second semiconducting material 15. The second semiconducting material 15 is different from the first semiconducting material 13 and it may be chosen so that it can be selectively etched relative to the first semiconducting material. The second semiconducting material 15 may for example be $Si_{1-x}Ge_x$ where x>0.

Once the semiconducting stack has been made, the layers 12, 14 of this stack are etched so as to form at least one semiconducting structure 17 comprising an alternation of superposed semiconducting elements $20_1$, $20_2$, ..., $20_k$, $20_{k+1}$ based on the first semiconducting material 13 and the second semiconducting material 15, and at least one other structure 19 comprising an alternation of superposed semiconducting elements $20_1$, $20_2$, ..., $20_k$, $20_{k+1}$ based on the first semiconducting material 13 and the second semiconducting material 15. Depending on the ratio between the corresponding widths W and lengths L, the semiconducting elements $20_1$, $20_2$, ..., $20_k$, $20_{k+1}$, may for example be in the form of nanowires, or bars, or membranes parallel to the principal plane of the substrate. The principal plane of the substrate for the purpose of this description is defined as a plane passing through the substrate and that is parallel to the [0; x; y] plane of the orthogonal coordinate system [0; x; y; z] given on the figures.

Structures 17 and 19 may be attached to each other by means of at least one anchor block 18 also formed in the stack of semiconducting layers 12, 14.

The structure 17 is provided on the substrate in a region $R_1$ in which there are one or several transistors of a given type, for example P type, while the other structure 19 is made on the substrate in another region $R_2$ in which there are one or several transistors of another type, for example N type.

Due to the initial strain of the surface layer 12 of the substrate, the semiconducting elements $20_1$, $20_3$, ..., $20_{k+1}$, based on the first semiconducting material 13 in structures 17 and 19 are strained, for example in tension.

In FIG. 1A, the semiconducting structures 17 and 19 are shown in a top view, while in FIG. 1B, only the structure 17 is shown in a cross-sectional view B'B. FIG. 1C shows a longitudinal sectional view A'A of this structure 17.

Figure 1D:
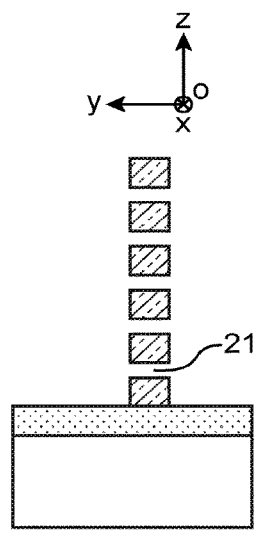
Figure 1E:
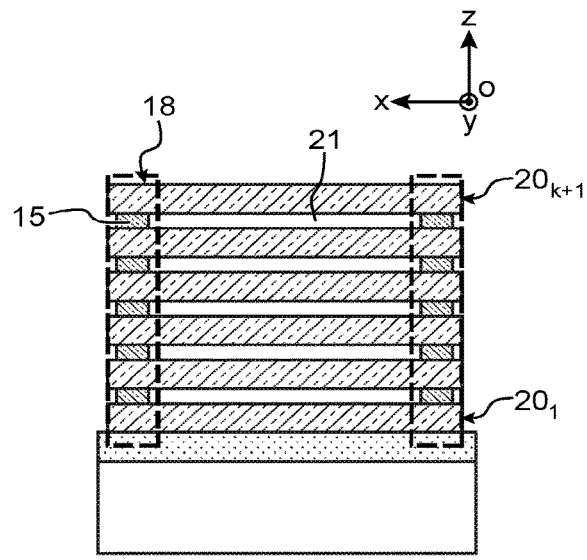

The next step is selective etching of the second semiconducting material 15 relative to the first semiconducting material 13 so as to at least partially remove the second semiconducting material 15 from the structure 17 and possibly from the other structure 19 when this other structure is also exposed during this etching (FIGS. 1D and 1E).

When the second semiconducting material 15 is $Si_{1-x}Ge_x$ it may be removed for example by isotropic $CF_4+O_2$-based plasma etching.

In structures 17 and 19, portions removed from the second semiconducting material 15 form empty spaces 21 between elements $20_1$, $20_3$, ..., $20_{k+1}$, based on the first semiconducting material 13.

In order to maintain structures 17, 19 despite this etching, anchor blocks 18 located at their end may be provided with dimensions in a plane parallel to the principal plane of the substrate larger than the dimensions W, L of the structures 17, 19. Thus, the selective etching of the second semiconducting material 15 is preferably done such that zones based on the second semiconducting material 15 are kept in the anchor blocks 18. Anchor blocks 18 may be sacrificial and located at the locations of the future transistor source and drain blocks.

Figure 1F:
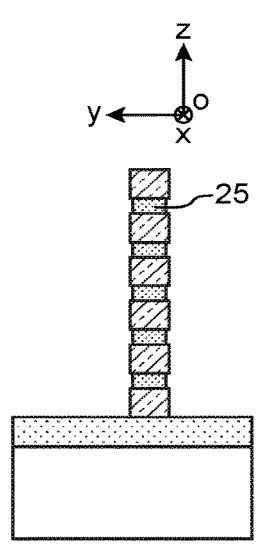
Figure 1G:
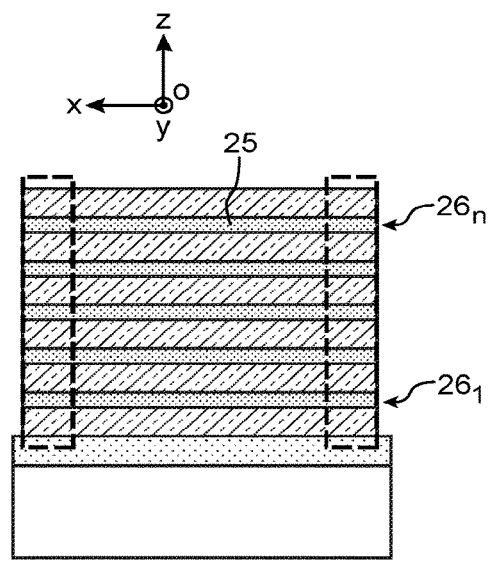
Figure 1H:
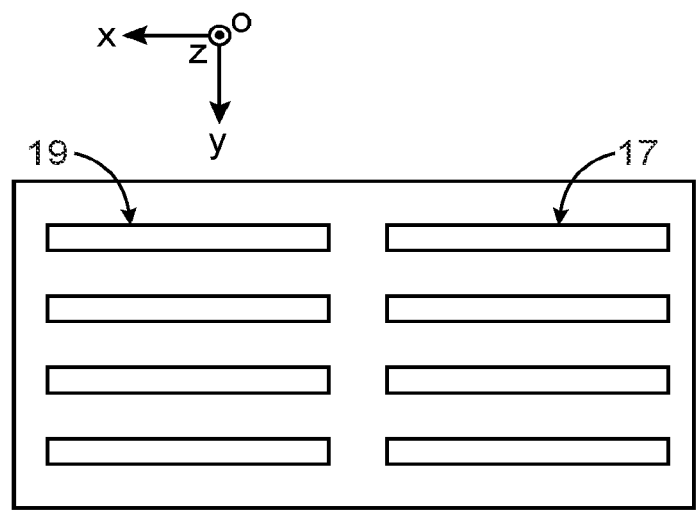
Figure 1I:
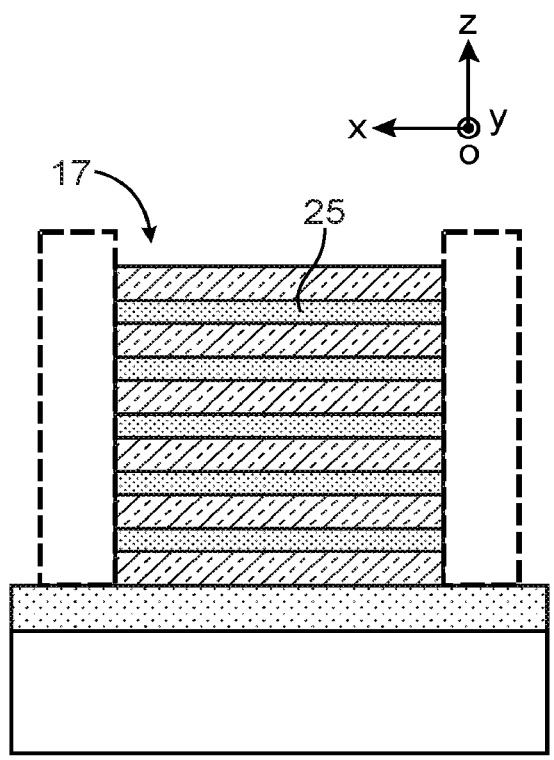

The next step is to fill the empty spaces 21 with a dielectric material 25 for example such as $SiO_2$ or silicon oxide doped with boron and/or phosphorus (FIGS. 1F and 1G). The dielectric material 25 is interposed between elements $20_1$, $20_3$, ..., $20_{k+1}$, based on the first semiconducting material 13 and is in contact with these elements $20_1$, $20_3$, ..., $20_{k+1}$.

Partial etching of the dielectric material 25, selective relative to the first semiconducting material 13 may then be done so as to form insulating replacement elements $26_1$, ..., $26_n$ (where n is an integer such that n>1) approximately with the same dimensions as the elements $20_2$, ..., $20_k$ based on the second semiconducting material that have just been removed. In a case for example in which the dielectric material 25 is $SiO_2$ and the first semiconducting material 13 is Si, this etching may be done for example using $CHF_3$ in an ICP (Inductive Coupled Plasma) reactor as disclosed in the document by N. R. Rueger, et al. J. Vac. Sci. Technol. A 175 . . . , Sep./Oct. 1999.

In the example embodiment in FIG. 1G, each insulating element $26_1, \ldots, 26_n$ made of a dielectric material 25 extends between two elements $20_1, 20_3, \ldots, 20_{k+1}$, based on the first semiconducting material 13, along the same direction as these elements $20_1, 20_3, \ldots, 20_{k+1}$.

At this stage of the method, the semiconducting elements $20_1, 20_3, \ldots, 20_{k+1}$ based on the first semiconductor 13 may be strained in tension, while the insulating elements $26_1, \ldots, 26_n$ based on dielectric material 25 may be slightly compressively strained.

The anchor block(s) 18 and particularly the anchor block separating the structures 17 and 19 (FIGS. 1H and 1I) may then be removed. This can be done by means of photolithography and etching steps through a stencil provided with one or several openings exposing the anchor blocks 18.

The next step is to form a straining zone 31 on the structure 17 based on a material 33 with an intrinsic strain. In this example, the material 33 is a dielectric material strained in tension, for example $Si_xN_y$ strained in tension. In this example embodiment in which the objective is to relax the structure 17, the straining zone 31 is designed to apply a strain in the material 13 of the semiconducting elements $20_1, 20_3, \ldots, 20_{k+1}$ that is opposite to the strain in the surface layer 12 and in the semiconducting elements $20_1, 20_3, \ldots, 20_{k+1}$ after growth of the stack of semiconducting layers. The straining zone 31 is made on region $R_1$ in which there will be one or several N type transistors.

At the same time, when the objective is to maintain a strain in the other structure 19, there is no straining zone 31 or the straining zone is not maintained on this other structure 19.

To obtain such an arrangement, the material 33 may be deposited on the regions $R_1$ and $R_2$ and then removed facing the other region $R_2$, for example by photolithography and then etching.

Figure 1J:
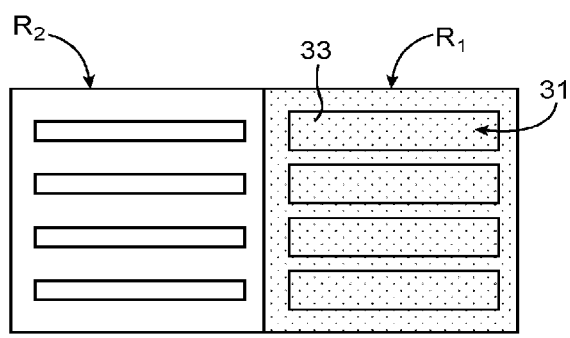
Figure 1K:
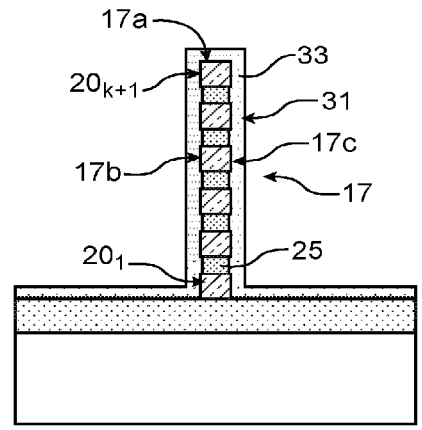
Figure 1L:
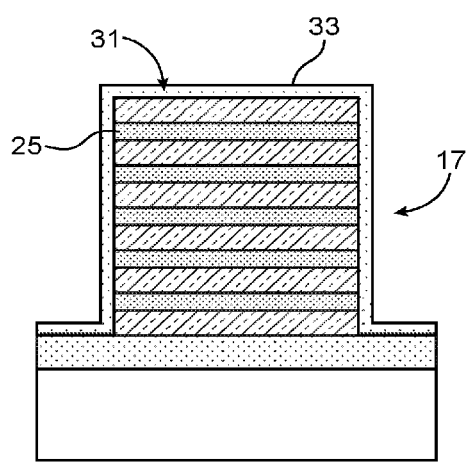

The straining zone 31 thus formed covers the structure 17 and extends particularly on a top face 17a and side faces 17b, 17c of the structure 17, while the other structure 19 is not covered by this zone 31 (FIGS. 1J, 1K, and 1L).

The next step is thermal annealing for which the temperature and duration are selected so as to modify the visco-elastic behaviour of the dielectric material 25 so as to make it creep and relax. This creep is likely to cause a change in the strain state in elements $20_1, 20_3, \ldots, 20_{k+1}$ of the first structure 17 that are based on the first semiconducting material 13. The straining zone material 33 is preferably chosen with a high melting temperature such that it does not creep during thermal annealing intended to make the dielectric material 25 creep.

Thermal annealing of the dielectric material 25 may be done at a temperature and for a duration such that the stress in the semiconducting material 13 changes by at least 1 GPa starting from an sSOI substrate with a stress of 1.4 GPa.

Such annealing may for example be done at a temperature between 1000° C. and 1400° C. for a duration for example of the order of 2 h when the dielectric material 25 made is $SiO_2$.

When the dielectric material 25 is based on silicon oxide doped for example with phosphorus or boron or phosphorus and boron such as BPSG (Boron and Phosphorus Doped Glass), a temperature range lower than the annealing temperature may advantageously be used. For example, annealing can be done at a temperature between 500° C. and 800° C. for example for a duration of the order of 2 h when the dielectric material 25 is BPSG.

In this example embodiment, due to the thermal creep annealing of the dielectric material 25 that is interposed between elements $20_1, 20_3, \ldots, 20_{k+1}$, these elements $20_1, 20_3, \ldots, 20_{k+1}$ of the structure 17 based on the first semiconducting material 13 initially strained in tension are relaxed. Such annealing thus amplifies the effect of the straining zone 31 on the structure 17.

Once annealing has been done, the next step can be to remove the straining zone 31 based on the material 33 in the region $R_2$ of the N type transistors. This removal may for example be done by wet etching using hot phosphoric acid when the material 33 is based on silicon nitride.

In this embodiment, a relaxed structure 17 is thus formed in the region $R_1$ of the substrate intended to form a channel region of a P type transistor, while a structure 19 strained in tension is kept to form a channel region of an N type transistor in the region $R_2$.

Figure 1M:
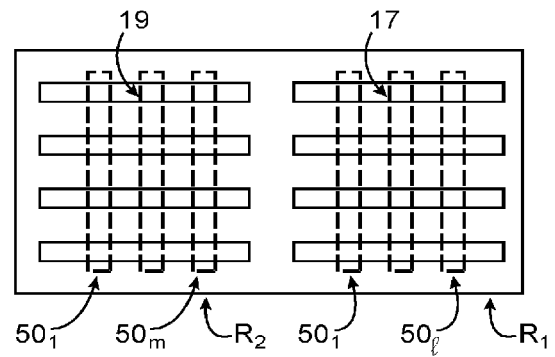

The formation of transistors can then be completed in particular by making one or several gate blocks $50_1, \ldots, 50_m$, on the structure 17 and one or several blocks $50_1, \ldots, 50_l$ on the other structure 19 (FIG. 1M).

These gate blocks $50_1, \ldots, 50_m$, may be formed in contact with the lateral faces and the top face of the structures 17 and 19 so as to coat them.

In the example embodiment shown in FIGS. 1A-1M, the channel regions of the P type transistor and of the N type transistor are formed from several juxtaposed semiconducting structures identical to structure 17 and several juxtaposed semiconducting structures identical to the other structure 19, respectively. The number of semiconducting structures to form the channel region of the transistors is not limited and may possibly vary from one transistor to the other.

Figure 2A:
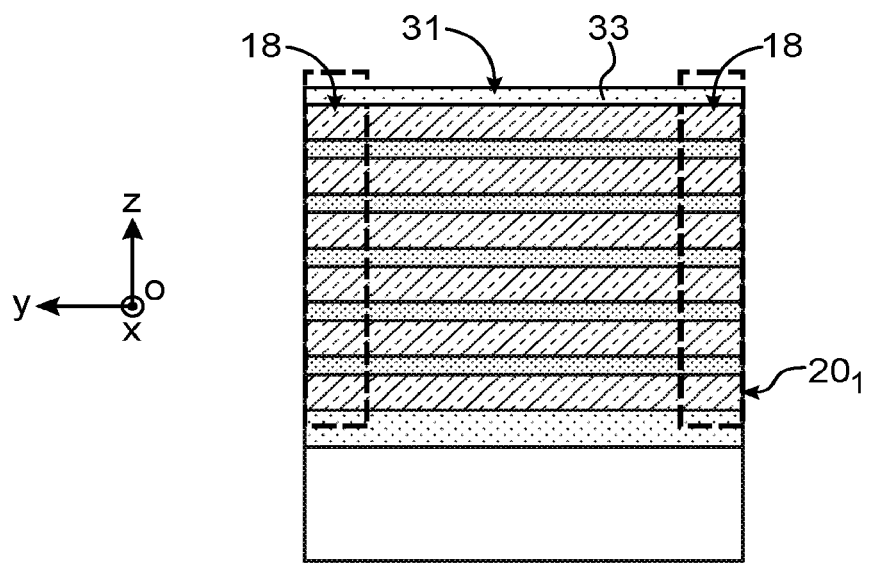
FIGS. 2A-2B show a variant embodiment of the first example of the method.
Figure 2B:
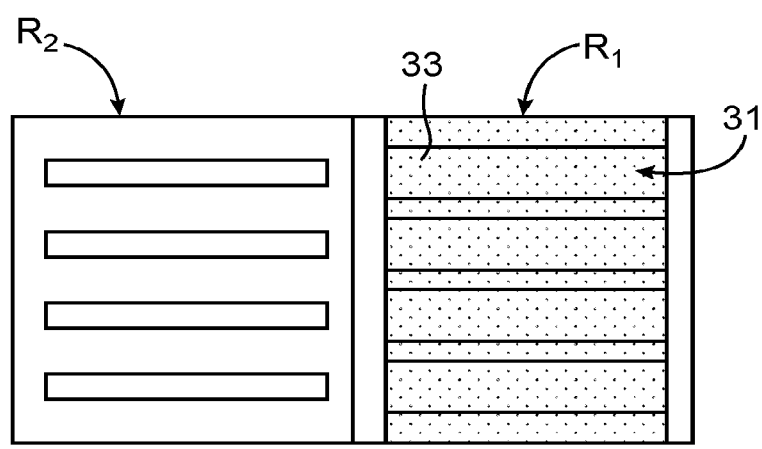

A variant of the example method that has just been described is shown in FIGS. 2A-2B. With this variant, the step to remove the anchor block(s) 18 located between semiconducting structures 17 and 19 is delayed.

Once the steps described above with reference to FIGS. 1A-1G have been completed and portions of the second semiconducting material 15 have been replaced by the dielectric material 25 between the elements based on the first semiconducting material 13, the straining zone 31 is created. This is done by depositing the material 33 based on material 33 with an intrinsic elastic strain, on regions $R_1$ and $R_2$ (FIG. 2A).

This material 33 is then removed from a zone facing the anchor block(s) 18.

The anchor block(s) 18 may then be removed by etching, making use of the straining zone 31 as an etching protective stencil.

The material 33 facing the other region $R_2$ is then removed (FIG. 2B).

Figure 3A:
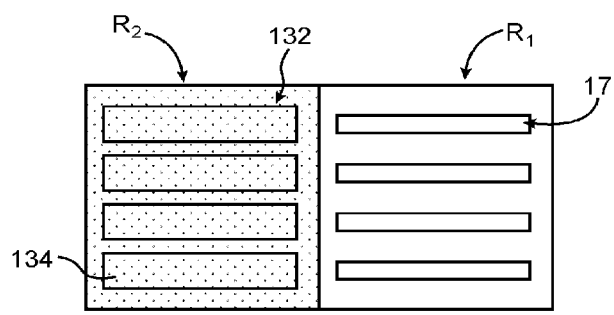
FIGS. 3A-3C show a second example of the method to increase the strain in a stacked channel semiconducting structure of a second transistor.
Figure 3B:
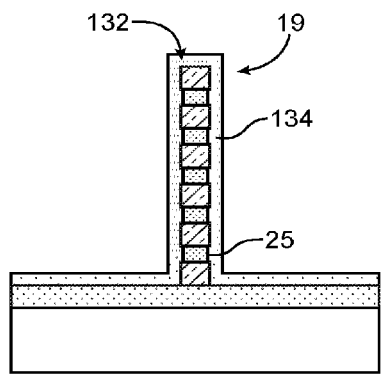

Another example embodiment shown in FIGS. 3A-3B, requires that after the steps described above with reference to FIGS. 1A-1I have been done and after the anchor block(s) 18 has (have) been removed, a straining zone 132 should be formed on the region $R_2$ in which there will be one or several N type transistors.

The straining zone 132 in this case is based on a material 134 with an intrinsic strain opposite to that used in the previous examples and formed on the first region $R_1$. In this example, the straining zone 132 is based on a dielectric material 134 compressively strained for example such as $Si_xN_y$ compressively strained.

Figure 3C:
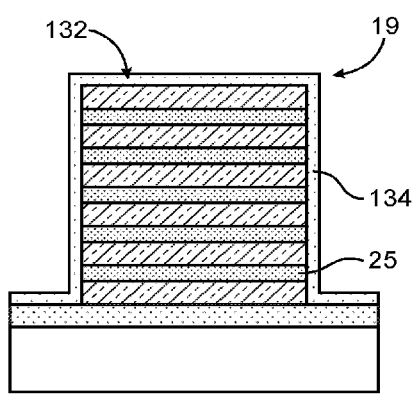

In order to form this zone 132, the material 134 may be deposited on the regions R₂ and R₁ and then removed facing the region R₁, for example by photolithography and then etching. FIG. 3A shows a top view of the device during production. Only the other structure 19 is shown in FIGS. 3B and 3C, in a cross-sectional view and a longitudinal sectional view respectively. In this example, the straining zone 132 is used to create a tensile strain in the elements based on the first semiconducting material 13 of the other structure 19.

The next step is to perform the high temperature thermal annealing step so as to make the dielectric material 25 interposed between the elements based on the first semiconducting material 13, creep or relax.

Creep or relaxation of the dielectric material 25 formed in the stack and interposed between the semiconducting elements causes a change in the strain in these elements based on the first semiconducting material 13 of the other structure 19.

Such annealing may for example be done at a temperature between 1000° C. and 1400° C. for example for a duration of the order of 2 h when the dielectric material 25 made is $SiO_2$.

In this case, creep of the dielectric material 25 increases the tensile strain generated by the straining zone 132 in the elements of the structure 19 that are based on the first semiconducting material 13.

Thus in the example embodiment that has just been described above, the change in the strain achieved by thermal annealing of the dielectric material 25 can increase the tensile strain induced in the structure 19 of the N type transistor(s).

This other example embodiment described with reference to FIGS. 1A-1C may be combined with that described with reference to FIGS. 1K-1M so that the structure 17 can be relaxed and the structure 19 can be further strained in tension.

The steps described with reference to FIGS. 3A-3C can thus be performed before the steps described with reference to FIGS. 1K-1M or after the steps described with reference to FIGS. 1K-1M.

Figure 4:
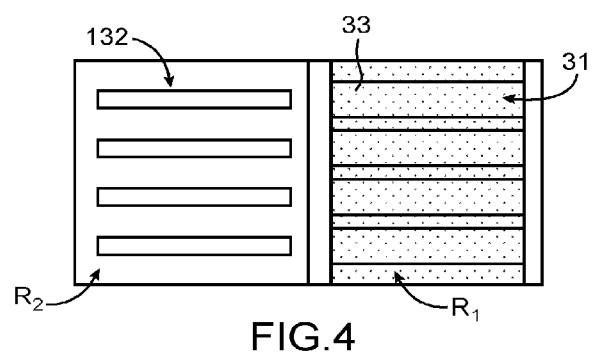
FIG. 4 shows a variant in which the first example and the second example of the method are combined so as to relax a stacked channel semiconducting structure of a first transistor while increasing the strain in a stacked channel semiconducting structure of a second transistor.

In the example embodiment shown in FIG. 4, a straining zone 31 based on a material 33 with an intrinsic tensile strain, for example silicon nitride strained in tension, is formed in the region R₁ on the structure 17, while another straining zone 132 based on a material 434 with an opposite intrinsic strain, for example silicon nitride compressively strained, is formed in the region R₂ on the other structure 19.

The next step is to perform an annealing so as to make the dielectric material 25 creep in the structures 17 and 19 and impose a compressive strain in the semiconductor of the structure 17 while increasing the tensile strain in the semiconductor in the structure 19.

As an example variant of the method described above with reference to FIGS. 1A-1M, it is also possible to compressively strain the structure 17. In this case the initial substrate may be an 501 type substrate with a relaxed surface layer 12.

One example variant of the embodiment described above with reference to FIGS. 3A-3C starts from an SiGeOI type substrate, in this case with a surface layer 12 based on SiGe.

In this case, the semiconducting stack from which the structures 17, 19 are made may be composed of an alternation of $Si_{1-y}Ge_y$-based layers 12 where y>0 and Si-based layers 14.

In this case, the second semiconducting material 15 is removed by selective etching in structures 17, 19, for example using a method like that described for example in the document by Stéphan Borel et al. <<Control of selectivity between SiGe and Si in Isotropic Etching Processes>>, Japanese Journal of Applied Physics, 2004.

The next step is to form a tensile straining zone for example made of nitride strained in tension on the structure 19 so as to strain compressively strain it.

The next step is creep or relaxation thermal annealing of the dielectric material 25 in order to compressively strain in this structure 19.

One example variant of the embodiment that has just been described with reference to FIGS. 1A-1M starts from an sSiGeOI type substrate, in this case with a surface layer 12 based on SiGe with an intrinsic compressive strain.

Then, if the structure 17 is to be relaxed, the next step is to form a compressive straining zone on this structure, for example made of nitride compressively strained before creep or relaxation thermal annealing of the dielectric material 25.

A straining zone intended to cover the stack formed from an alternation of semiconducting elements and elements made of a dielectric material 25 may be formed based on a material other than silicon nitride. For example, a TiN layer can be used as the tensile straining layer.

Due to the refractory nature of TiN and the difference between the coefficients of thermal expansion for TiN and for the silicon (Si) substrate, when the temperature, is increased, TiN maintains an elastic behaviour and becomes increasingly compressive with an increase of the order of −2.1 MPa/° C. If the initial stress is −500 MPa at 30° C., it may reach a value of the order of −2600 GPa at 1030° C.

When TiN is deposited using the PVD (Physical Vapour Deposition) technique, it is usually compressive at ambient temperature. If a TiN based straining layer is deposited by CVD (Chemical Vapour Deposition), the initial compressive strain of the TiN layer can be lower.

Figure 5:
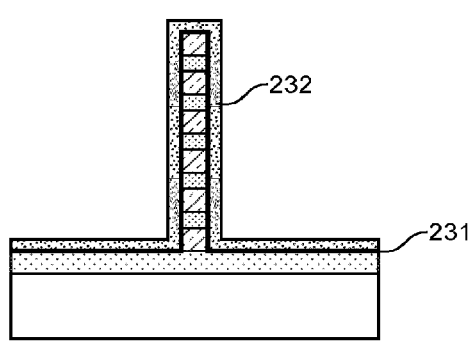
FIG. 5 shows a variant layout of a straining zone formed on the stacked semiconducting structure.

In order to prevent contamination of semiconducting elements when a TiN straining zone 232 is formed, a thin barrier layer 231 may be provided based on an insulating material between the straining zone 232 and the structure composed of an alternation of semiconducting elements and the dielectric material 25. For example, the barrier layer 231 is an $SiO_2$-based layer with a thickness of less than 1 nm (FIG. 5).

The invention claimed is:

1. A method of modifying a strain state of a first channel structure in at least one first transistor, the first channel structure being formed from superposed semiconducting elements, the method comprising:
   a) providing at least one first semiconducting structure on a substrate, said structure being formed from a semiconducting stack comprising alternating elements based on at least one first semiconducting material and elements based on at least one second semiconducting material different from the at least one first semiconducting material; then
   b) removing portions of the at least one second semiconducting material from the at least one first semiconducting structure by selective etching, the removed portions of the at least one second semiconducting material forming at least one empty space;
   c) filling the at least one empty space with a dielectric material;
   d) forming a straining zone on the at least one first semiconducting structure based on a first strained material having an intrinsic strain; and e) performing thermal annealing to cause the dielectric material to creep, and to cause a change in a strain state of the elements based on the at least one first semiconducting material in the at least one first semiconducting structure.

2. The method according to claim 1,
wherein the substrate is a strained semiconductor-on-insulator type substrate including a strained surface semiconducting layer, and
wherein the change in the stain state in step e) is relaxation of the elements based on the at least one first semiconducting material.

3. The method according to claim 1,
wherein the substrate is a strained semiconductor-on-insulator type substrate including a relaxed surface semiconducting layer, and
wherein the change in the strait state in step e) is an increase in a strain state induced by the straining zone in the elements based on the at least one first semiconducting material.

4. The method according to claim 1, wherein the dielectric material is based on $SiO_2$ or a doped silicon oxide.

5. The method according to claim 1, wherein the at least one first semiconducting material is Si and the at least one second semiconducting material is $Si_{1-y}Ge_y$, where $0<y<1$, or the at least one second semiconducting material is Si and the at least one first semiconducting material is $Si_{1-x}Ge_x$, where $0<x<1$.

6. The method according to claim 1, further comprising after step e), removing the straining zone while maintaining a strain state of the dielectric material that has undergone creep.

7. The method according to claim 1,
further comprising providing at least one second transistor having a second channel structure formed from superposed semiconducting elements, and at least one second semiconducting structure formed in the semiconducting stack,
wherein the at least one second semiconducting structure formed in the semiconducting stack comprises alternating elements based on the at least one first semiconducting material and elements based on the at least one second semiconducting material different from the first semiconducting material provided in step a), and
wherein step d) further comprises:
depositing the first strained material on the at least one first semiconducting structure and on the at least one second semiconducting structure, then
removing the first strained material from the at least one second semiconducting structure.

8. The method according to claim 7, further comprising forming another straining zone on the at least one second semiconducting structure based on a second strained material having an intrinsic strain opposite to the intrinsic strain of the first strained material.

9. The method according to claim 7,
wherein the at least one first semiconducting structure and the at least one second semiconducting structure are attached to each other by at least one anchor block, and
wherein the at least one anchor block is removed before step e).

10. The method according to claim 9, wherein the at least one anchor block is removed after step d) by etching where the straining zone is used as a protective stencil for the etching.

* * * * *